(12) United States Patent
Kong (10) Patent No.: US 11,133,275 B2
(45) Date of Patent: Sep. 28, 2021

(54) METHOD FOR IMPROVING WIRE BONDING STRENGTH OF AN IMAGE SENSOR

(71) Applicants: SEMICONDUCTOR MANUFACTURING INTERNATIONAL (BEIJING) CORPORATION, Beijing (CN); SEMICONDUCTOR MANUFACTURING INTERNATIONAL (SHANGHAI) CORPORATION, Shanghai (CN)

(72) Inventor: Yunlong Kong, Shanghai (CN)

(73) Assignees: SEMICONDUCTOR MANUFACTURING INTERNATIONAL (BEIJING) CORPORATION, Beijing (CN); SEMICONDUCTOR MANUFACTURING INTERNATIONAL (SHANGHAI) CORPORATION, Shanghai (CN)

( * ) Notice: Subject to any disclaimer, the term of this patent is extended or adjusted under 35 U.S.C. 154(b) by 160 days.

(21) Appl. No.: 15/663,531

(22) Filed: Jul. 28, 2017

(65) Prior Publication Data

US 2018/0096958 A1 Apr. 5, 2018

(30) Foreign Application Priority Data

Sep. 30, 2016 (CN) .......................... 201610871337.9

(51) Int. Cl.
*H01L 23/48* (2006.01)
*H01L 23/00* (2006.01)
(Continued)

(52) U.S. Cl.
CPC .............. *H01L 24/05* (2013.01); *H01L 24/03* (2013.01); *H01L 27/1469* (2013.01);
(Continued)

(58) Field of Classification Search
CPC ....... H01L 2924/00014; H01L 2924/00; H01L 2924/0002; H01L 2224/48091;
(Continued)

(56) References Cited

U.S. PATENT DOCUMENTS 8,802,504 B1 * 8/2014 Hou .................. H01L 23/49811
438/108
9,800,213 B1 * 10/2017 Khalil ..................... H01L 23/66
(Continued)

FOREIGN PATENT DOCUMENTS

CN    1216398    5/1999
CN    104952822    9/2015
(Continued)

OTHER PUBLICATIONS

European Application No. 17192405.3, Partial European Search Report dated Feb. 14, 2018, 16 pages.
(Continued)

*Primary Examiner* — Samuel Park
(74) *Attorney, Agent, or Firm* — Anova Law Group, PLLC (57) ABSTRACT

A method for manufacturing a bond pad structure includes providing a substrate structure including a substrate, a first metal layer on the substrate, and a passivation layer on the first metal layer, the passivation layer having an opening extending to the first metal layer; and filling the opening of the passivation layer with a second metal layer. The bond pad structure has a significantly increased thickness com-
(Continued)

pared with the thickness of the exposed portion of the first metal layer in the opening, thereby ensuring wire bonding reliability and yield.

10 Claims, 5 Drawing Sheets

(51) Int. Cl.
*H01L 27/146* (2006.01)
*H04N 5/369* (2011.01)
*H01L 23/31* (2006.01)

(52) U.S. Cl.
CPC .. *H01L 27/14621* (2013.01); *H01L 27/14623* (2013.01); *H01L 27/14634* (2013.01); *H01L 27/14636* (2013.01); *H01L 27/14643* (2013.01); *H01L 27/14645* (2013.01); *H01L 27/14685* (2013.01); *H04N 5/369* (2013.01); H01L 23/3171 (2013.01); H01L 2224/0212 (2013.01); H01L 2224/034 (2013.01); H01L 2224/03602 (2013.01); H01L 2224/03616 (2013.01); H01L 2224/05093 (2013.01); H01L 2224/05098 (2013.01); H01L 2224/05124 (2013.01); H01L 2224/05147 (2013.01); H01L 2224/05624 (2013.01); H01L 2224/48227 (2013.01); H01L 2224/73265 (2013.01)

(58) Field of Classification Search
CPC ......... H01L 23/585; H01L 2224/05624; H01L 2224/05647; H01L 2224/48227; H01L 2924/00012; H01L 2924/14; H01L 2924/0105; H01L 2924/0132; H01L 24/05; H01L 24/03; H01L 27/14685; H01L 27/1469; H01L 27/14621; H01L 27/14634; H01L 27/14636; H01L 27/14623; H01L 27/14645; H01L 27/14643; H01L 2224/05124; H01L 2224/034; H01L 2224/05147; H01L 23/3171; H01L 2224/73265; H01L 2224/0212; H01L 2224/03602; H01L 2224/03616; H01L 2224/05098; H01L 2224/05093; H01L 24/49; H01L 24/85; H01L 21/76877; H01L 23/53295; H01L 21/768; H01L 23/528; H01L 24/08; H01L 25/0657; H01L 23/05; H04N 5/369
See application file for complete search history.

(56) References Cited

U.S. PATENT DOCUMENTS

| | | | |
|---|---|---|---|
| 2001/0038115 A1* | 11/2001 | Amanuma | H01L 21/76838 257/303 |
| 2004/0175918 A1 | 9/2004 | Niu et al. | |
| 2005/0121803 A1* | 6/2005 | Angell | H01L 24/03 257/779 |
| 2006/0065969 A1* | 3/2006 | Antol | H01L 23/3171 257/700 |
| 2007/0057363 A1* | 3/2007 | Nakamura | H05K 3/4682 257/698 |
| 2008/0185724 A1* | 8/2008 | Tseng | H01L 23/53223 257/762 |
| 2008/0251929 A1* | 10/2008 | Kageyama | H01L 21/76816 257/773 |
| 2009/0309232 A1* | 12/2009 | Roy | H01L 21/76898 257/774 |
| 2010/0164082 A1 | 7/2010 | Fujisawa | |
| 2011/0115073 A1* | 5/2011 | Chen | H01L 24/05 257/737 |
| 2011/0175232 A1 | 7/2011 | Ota et al. | |
| 2011/0266679 A1 | 11/2011 | Hotta et al. | |
| 2012/0104541 A1* | 5/2012 | Chiu | H01L 23/3192 257/508 |
| 2012/0112322 A1* | 5/2012 | Lin | H01L 21/76898 257/618 |
| 2013/0256893 A1* | 10/2013 | Tsai | H01L 23/5226 257/758 |
| 2013/0319129 A1* | 12/2013 | Mathew | G01N 19/04 73/827 |
| 2014/0061924 A1* | 3/2014 | Chen | H01L 23/528 257/758 |
| 2015/0270234 A1* | 9/2015 | Li | H01L 24/05 257/758 |
| 2016/0351474 A1* | 12/2016 | Dote | H01L 21/31 |
| 2017/0186732 A1* | 6/2017 | Chu | H01L 21/76898 |

FOREIGN PATENT DOCUMENTS

| | | |
|---|---|---|
| EP | 913863 | 5/1999 |
| WO | 03044858 | 5/2003 |
| WO | 2006101270 | 9/2006 |

OTHER PUBLICATIONS

European Application No. 17192405.3, Extended European Search Report dated May 9, 2018, 19 pages.
Chinese Patent Application No. 201610871337.9, Office Action dated Mar. 28, 2019, 8 pages.

* cited by examiner

METHOD FOR IMPROVING WIRE BONDING STRENGTH OF AN IMAGE SENSOR

CROSS-REFERENCES TO RELATED APPLICATIONS

The present application claims priority to Chinese patent application No. 201610871337.9, filed with the State Intellectual Property Office of People's Republic of China on Sep. 30, 2016, the content of which is incorporated herein by reference in its entirety.

FIELD OF THE DISCLOSURE

The present disclosure relates generally to semiconductor technology, and more particularly, to a pad structure, a manufacturing method thereof, and an image sensor including the pad structure.

BACKGROUND OF THE INVENTION

Chip-on-board (COB) package technology is currently used in digital imaging applications and suitable for packaging a CMOS image sensor. In a COB package, the reliability of wire bonding will directly affect the quality of the package. Therefore, improving reliability of wire bonding is very important to improve the yield issue caused by wire bonding.

In general, the metal layer of a CMOS image sensor is relatively thin in order to increase light absorption of the photosensitive device. A thin bonding pad may result in a weak bonding strength of a gold ball pressed to the bonding pad, which may likely cause an open circuit, thereby affecting the yield of the wire bonding.

Therefore, there is a need for a novel bonding pad structure that can improve the compressive strength of the bonding pad to increase the yield of the wire bonding structure.

BRIEF SUMMARY OF THE INVENTION

The present inventor has discovered that the thin metal layer in a CMOS image sensor can result in a weak bonding strength or even an open circuit when a gold ball is pressed against the bonding pad of the CMOS image sensor and provides a novel manufacturing method for an improved bonding pad structure to solve the open circuit or weak bonding strength problem.

According to some embodiments of the present disclosure, a method for manufacturing a bond pad structure may include providing a substrate structure including a substrate, a first metal layer on the substrate, and a passivation layer on the first metal layer, the passivation layer having an opening extending to the first metal layer; and filling the opening of the passivation layer with a second metal layer.

In one embodiment, filling the opening includes forming the second metal layer on the substrate structure, and etching the second metal layer using the passivation layer as an etch stop layer so as to retain the second metal layer in the opening.

In one embodiment, filling the opening includes forming the second metal layer on the substrate structure, and performing a planarization process on the second metal layer so as to retain the second metal layer in the opening.

In one embodiment, providing the substrate structure includes providing the substrate, forming the first metal layer on the substrate, forming a passivation layer on the first metal layer, and etching the passivation layer to remove a portion of the passivation layer to form the opening exposing a desired region of the first metal layer.

In one embodiment, the substrate includes a third metal layer disposed below the first metal layer, a first dielectric layer disposed between the first metal layer and the third metal layer, and a first metal plug in the first dielectric layer.

In one embodiment, the first metal layer includes a first number of spaced apart segments and the third metal layer comprises a second number of spaced apart segments.

In one embodiment, the first number of spaced apart segments is smaller than the second number of spaced apart segments; and a segment of the first number of spaced apart segments is electrically connected to one or more segments of the second number of spaced apart segments.

In one embodiment, the substrate further includes a fourth metal layer disposed below the third metal layer, a second dielectric layer disposed between the third metal layer and the fourth metal layer, and a second metal plug in the second dielectric layer.

In one embodiment, the fourth metal layer comprises a third number of spaced apart segments. The second number of spaced apart segments is smaller than the third number of spaced apart segments; and a segment of the second number of spaced apart segments is electrically connected to one or more segments of the third number of spaced apart segments.

In one embodiment, the first and second metal layers each include aluminum. The passivation layer includes a silicon oxide layer on the first metal layer and a silicon nitride layer on the silicon oxide layer.

Embodiments of the present invention also provide a bond pad structure. The bond pad structure includes a substrate, a first metal layer on the substrate, a passivation layer on the first metal layer and having an opening extending to the first metal layer, and a second metal layer filling the opening of the passivation layer and serving as a bonding pad.

In one embodiment, the second metal layer has an upper surface that is flush with an upper surface of the passivation layer.

In one embodiment, the substrate includes a third metal layer disposed below the first metal layer, a first dielectric layer disposed between the first metal layer and the third metal layer, and a first metal plug in the first dielectric layer.

In one embodiment, the first metal layer includes a first number of spaced apart segments and the third metal layer comprises a second number of spaced apart segments. The first number of spaced apart segments is smaller than the second number of spaced apart segments; and a segment of the first number of spaced apart segments is electrically connected to one or more segments of the second number of spaced apart segments.

In one embodiment, the substrate further includes a fourth metal layer disposed below the third metal layer; a second dielectric layer disposed between the third metal layer and the fourth metal layer; a second metal plug in the second dielectric layer. In one embodiment, the substrate further includes a fourth metal layer disposed below the third metal layer; a second dielectric layer disposed between the third metal layer and the fourth metal layer; and a second metal plug in the second dielectric layer. In one embodiment, the second number of spaced apart segments is smaller than the third number of spaced apart segments; and a segment of the second number of spaced apart segments is electrically connected to one or more segments of the third number of spaced apart segments.

In one embodiment, each of the first and second metal layers includes aluminum. The passivation layer includes a silicon oxide layer on the first metal layer and a silicon nitride layer on the silicon oxide layer.

Embodiments of the present disclosure also provide an image sensor including the above-described bond pad structure. The image sensor may include a CMOS image sensor.

The following detailed description together with the accompanying drawings will provide a better understanding of the nature and advantages of the present disclosure.

DETAILED DESCRIPTION OF THE INVENTION

Embodiments of the present disclosure now will be described more fully hereinafter with reference to the accompanying drawings. The disclosure may, however, be embodied in many different forms and should not be construed as limited to the embodiments set forth herein. Rather, these embodiments are provided so that this disclosure will be thorough and complete, and will fully convey the scope of the disclosure to those skilled in the art. The features may not be drawn to scale, some details may be exaggerated relative to other elements for clarity. Like numbers refer to like elements throughout.

It will be understood that when an element such as a layer, region or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "lateral" or "vertical" may be used herein to describe a relationship of one element, layer or region to another element, layer or region as illustrated in the figures. It will be understood that these terms are intended to encompass different orientations of the device in addition to the orientation depicted in the figures.

The terminology used herein is for the purpose of describing particular embodiments only and is not intended to be limiting of the disclosure. As used herein, the singular forms "a", "an", and "the" are intended to include the plural forms as well, unless the context clearly indicates otherwise. It will be further understood that the terms "comprises", "comprising", "includes", and/or "including" when used herein, specify the presence of stated features, integers, steps, operations, elements, and/or components, but do not preclude the presence or addition of one or more other features, integers, steps, operations, elements, components, and/or groups thereof.

Embodiments of the disclosure are described herein with reference to cross-sectional illustrations that are schematic illustrations of idealized embodiments (and intermediate structures) of the disclosure. The thickness of layers and regions in the drawings may be enlarged relative to other layers and regions for clarity. Additionally, variations from the shapes of the illustrations as a result, for example, of manufacturing techniques and/or tolerances, are to be expected. Thus, embodiments of the disclosure should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a discrete change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the disclosure.

Embodiments of the present disclosure now will be described more fully hereinafter with reference to the accompanying drawings, in which embodiments of the disclosure are shown. This disclosure may, however, be embodied in many different forms and should not be construed as limited to the embodiments set forth herein.

It should be noted that like reference numerals and letters denote similar items in the accompanying drawings, therefore, once an item is defined or illustrated in a drawing, it will not be further described in a following drawing.

The present inventor has studied the above-described weak bonding strength or open circuit problems and discovered that a thick top metal layer will reduce the light absorption of an image sensor, thereby affecting the image quality of the image sensor. Thus, the present inventor provides the following method for manufacturing a bonding pad structure, the bonding pad structure, and a CMOS image sensor including the bonding pad structure.

Figure 1:
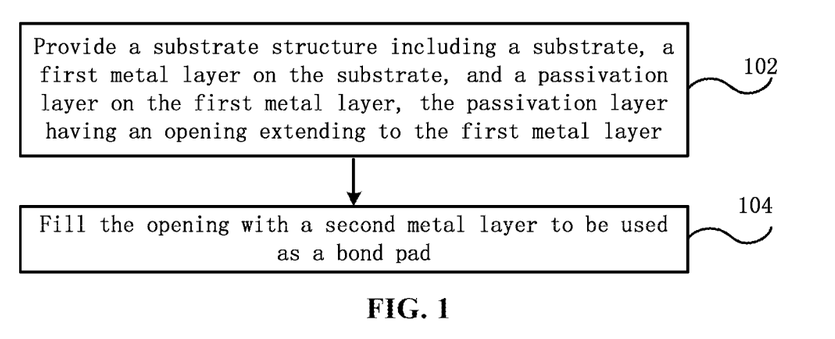
FIG. 1 is a simplified flowchart of a method for manufacturing a bonding pad structure according to an embodiment of the present disclosure.

FIG. 1 is a flowchart of a method for manufacturing a bonding pad structure according to an embodiment of the present disclosure. Referring to FIG. 1, the method may include the following steps:

Step 102: providing a substrate structure including a substrate, a first metal layer on the substrate, and a passivation layer on the first metal layer. The passivation layer has an opening extending to the first metal layer.

The substrate may include a semiconductor device and metal layers on the semiconductor device. The opening in the passivation layer exposes a portion of the first metal layer. The first metal layer may also be referred to as a top metal layer.

Step 104: filling the opening with a second metal layer that will be used as a bonding pad. Hereinafter, the terms "bonding pad", "bond pad", and "pad" may be used alternatively. The terms "bonding pad structure" and "bond pad structure" may be used alternatively.

In the embodiment, the second metal layer filling the opening in the passivation layer and used as a bonding pad has a significantly increased thickness compared with the thickness of the exposed portion of the first metal layer in the opening, thereby ensuring the reliability and yield of the wire bonding. This approach is simple and does not change the structure of other parts of the bonding pad structure. Further, the increase in the thickness of the bonding pad allows the tip of the needle of a probe card used in the test to strike against the bonding pad with a greater inclination angle and greater force to break through the oxide layer on the surface of the bonding pad to reach the surface of the pad metal, thereby improving the test accuracy.

The method shown in FIG. 1 will be described in detail with reference to three different embodiments.

Figure 2A:
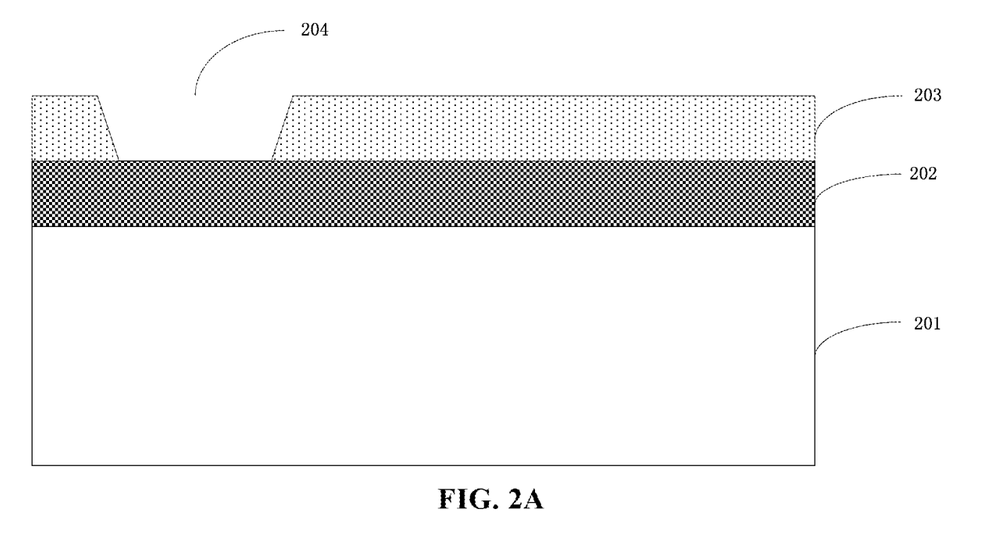
FIGS. 2A-2C are cross-sectional views illustrating intermediate stages of a method for manufacturing a bonding pad structure according to a first embodiment of the present disclosure.
Figure 2B:
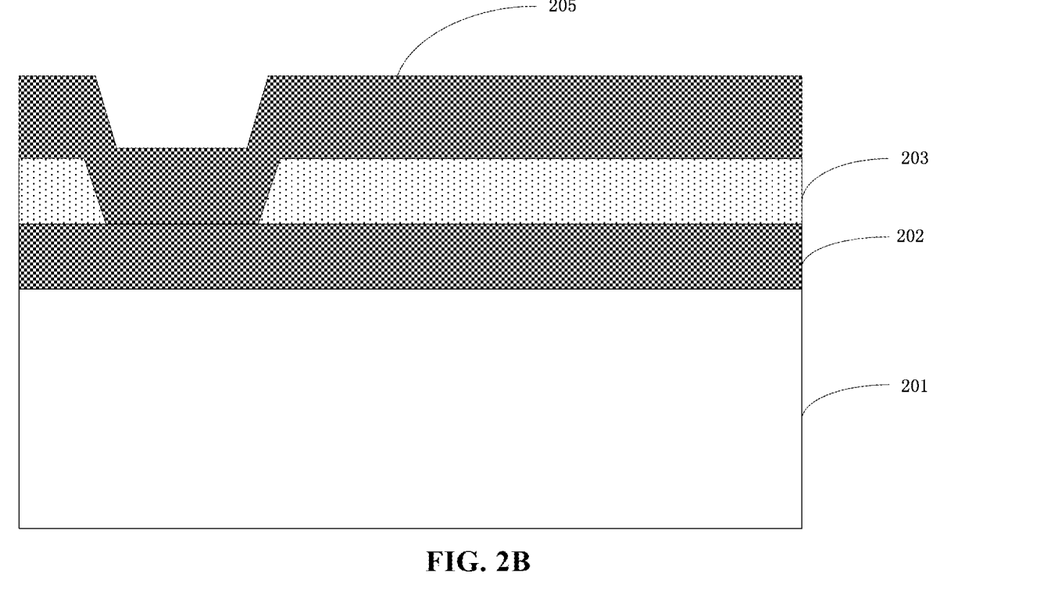
Figure 2C:
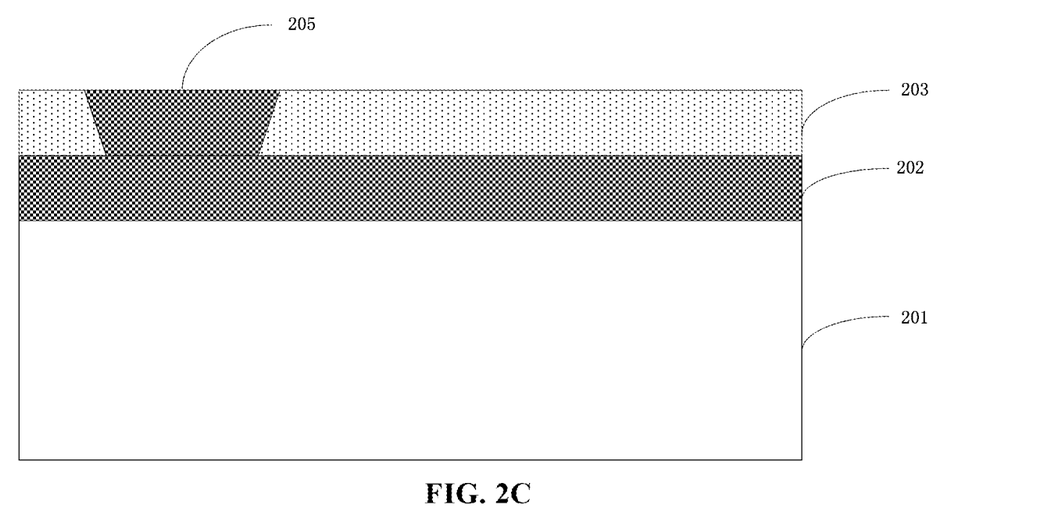

FIGS. 2A-2C are cross-sectional views illustrating intermediate stages of a method for manufacturing a bonding pad structure according to a first embodiment of the present disclosure.

Referring to FIG. 2A, a substrate structure is provided. The substrate structure includes a substrate 201, a first metal layer 202 on substrate 201, and a passivation layer 203 on first metal layer 202. Passivation layer 203 has an opening 204 extending to first metal layer 202 and exposing a portion of the first metal layer.

In one embodiment, the substrate structure may be formed by first providing a substrate 201 that may includes a semiconductor substrate, a semiconductor device, multiple metal layers, and the like. Then, a first metal layer 202, e.g., an aluminum layer, is deposited on substrate 202. Thereafter, a passivation layer 203 is deposited on first metal layer 202. Passivation layer 203 may include a silicon oxide layer on first metal layer 202 and a nitride layer of silicon (e.g., silicon nitride) on the silicon oxide layer. Thereafter, a portion of passivation layer 203 is removed by etching to form an opening 204 exposing a desired region of first metal layer 202. The desired region is the pad region.

Thereafter, a second metal layer is formed filling the opening.

Referring to FIG. 2B, a second metal layer 205, e.g., an aluminum layer, may be deposited on the substrate structure shown in FIG. 2A. Second metal layer 205 fills opening 204 and covers the surface of passivation layer 203.

Thereafter, in one embodiment, second metal layer 205 may be etched using the upper surface of passivation layer 203 as an etch stop layer to retain second metal layer 205 formed in opening 204, as shown in FIG. 2C. In another embodiment, a planarization process may be performed on second metal layer 205 shown in FIG. 2B to retain a portion of second metal layer 205 formed in opening 204 as shown in FIG. 2C. In one embodiment, the upper surface of second metal layer 205 and the upper surface of passivation layer 203 may be substantially flush, i.e., flush within the process deviation, such that second metal layer 205 filling opening 204 does not affect other portions of the pad structure.

A pad structure is obtained according to the method shown in FIGS. 2A-2C. The pad structure will be described below with reference to FIG. 2C.

Referring to FIG. 2C, the pad structure includes a substrate 201, a first metal layer 202 on substrate 201, a passivation layer 203 on first metal layer 202. Passivation 203 has an opening extending to first metal layer 202. The pad structure also includes a second metal layer 205 filing the opening. Second metal layer 205 serves a bonding pad.

Figure 3A:
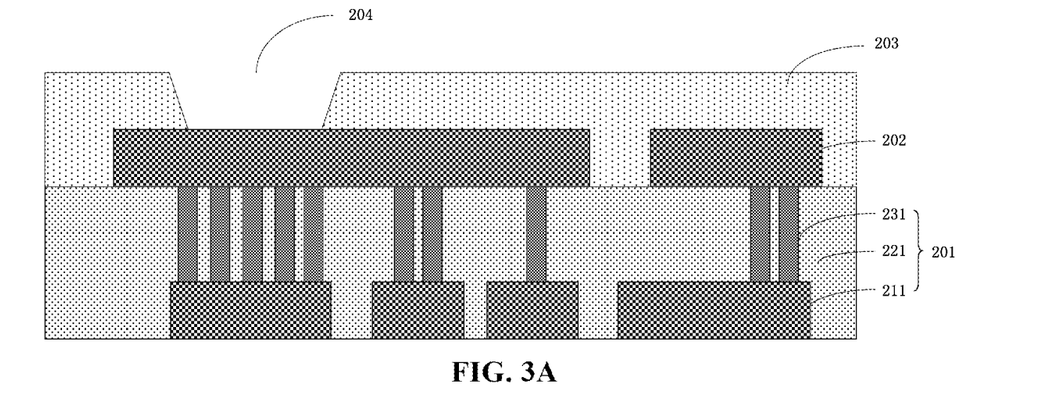
FIGS. 3A-3C are cross-sectional views illustrating intermediate stages of a method for manufacturing a bonding pad structure according to a second embodiment of the present disclosure.
Figure 3B:
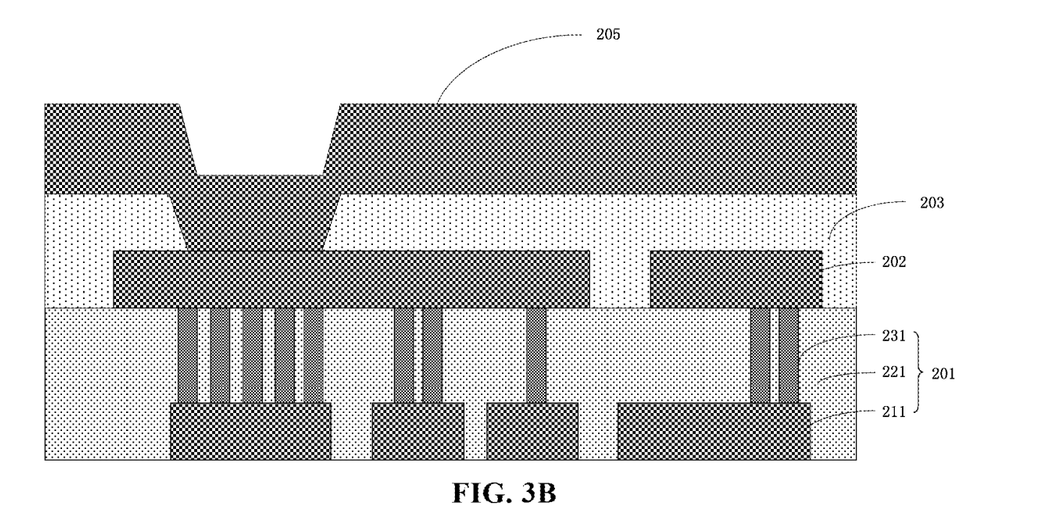
Figure 3C:
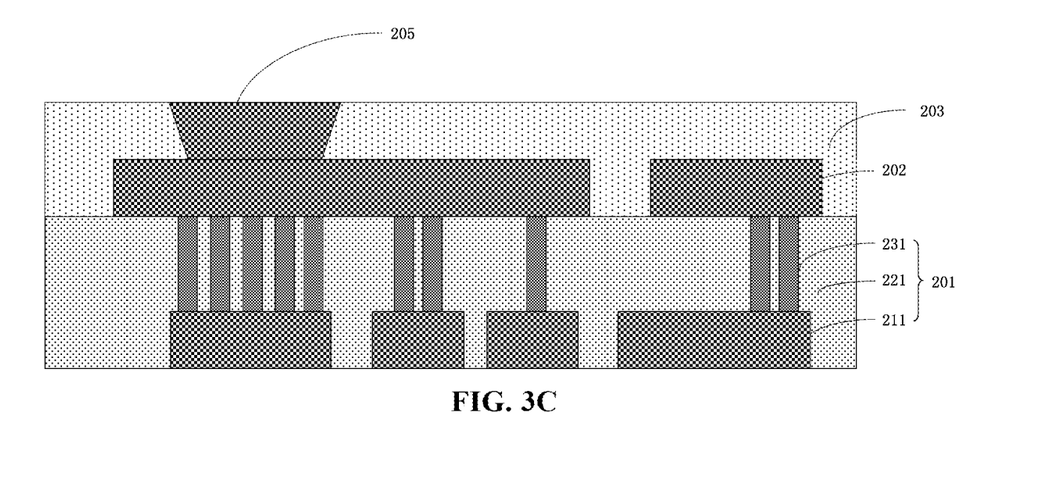

FIGS. 3A-3C are cross-sectional views illustrating intermediate stages of a method for manufacturing a bonding pad structure according to a second embodiment of the present disclosure. It should be noted that the differences from the first embodiment will be described in the following description, the parts similar to those of the first embodiment may be referred to the above description.

Referring to FIG. 3A, a substrate structure is provided. The substrate structure may include a substrate 201, a first metal layer 202 on substrate 201, and a passivation layer 203 on first metal layer 202. Passivation layer 203 has an opening 204 extending to first metal layer 202.

Substrate 201 may include a third metal layer (e.g., a copper layer) 211 disposed below first metal layer 202. Substrate 201 may also include a dielectric layer (e.g., a silicon oxide layer) 221 disposed between first metal layer 202 and third metal layer 211. Substrate 201 may further include a metal plug (e.g., a tungsten plug) 231 electrically connecting first metal layer 202 and third metal layer 211.

In one embodiment, first metal layer 202 and third metal layer 211 each may include a plurality of segments that are spaced apart from each other, as shown in FIG. 3A. In one embodiment, first metal layer 202 may include a first number of segments smaller than a second number of segments included in third metal layer 211. A segment of first metal layer 202 may be connected to one or more segments of third metal layer 211 through one or more metal plugs 231. In this way, the same voltage can be applied to the one or more of segments of third metal layer 211 through a segment of first metal layer 202.

Thereafter, a second metal layer is formed filling the opening.

Referring to FIG. 3B, a second metal layer (e.g., an aluminum layer) 205 is formed by deposition on the substrate structure shown in FIG. 3A. Second metal layer 205 fills opening 204 and covers the upper surface of passivation layer 203.

Thereafter, a portion of second metal layer 205 disposed outside the opening may be removed using techniques described above. For example, in one embodiment, second metal layer 205 may be etched using the upper surface of passivation layer 203 as an etch stop layer to retain second metal layer 205 formed in opening 204, as shown in FIG. 3C. In another embodiment, a planarization (e.g., a chemical mechanical polishing) process may be performed on second metal layer 205 shown in FIG. 3B to retain a portion of second metal layer 205 formed in opening 204 as shown in FIG. 3C. In one embodiment, the upper surface of second metal layer 205 and the upper surface of passivation layer 203 may be substantially flush, i.e., flush within the process tolerance, such that second metal layer 205 filling opening 204 does not affect other portions of the pad structure.

A bond pad structure is obtained according to the method shown in FIGS. 3A-3C. The bond pad structure will be described below with reference to FIG. 3C.

The bond pad structure shown in FIG. 3C also includes a third metal layer 211 disposed below first metal layer 202 as compared to the bond pad structure shown in FIG. 2C. The bond pad structure shown in FIG. 3C also includes a dielectric layer 221 disposed between first metal layer 202 and third metal layer 211, and a plurality of metal plugs 231 disposed in the dielectric layer and electrically connecting first metal layer 202 and third metal layer 211.

Figure 4A:
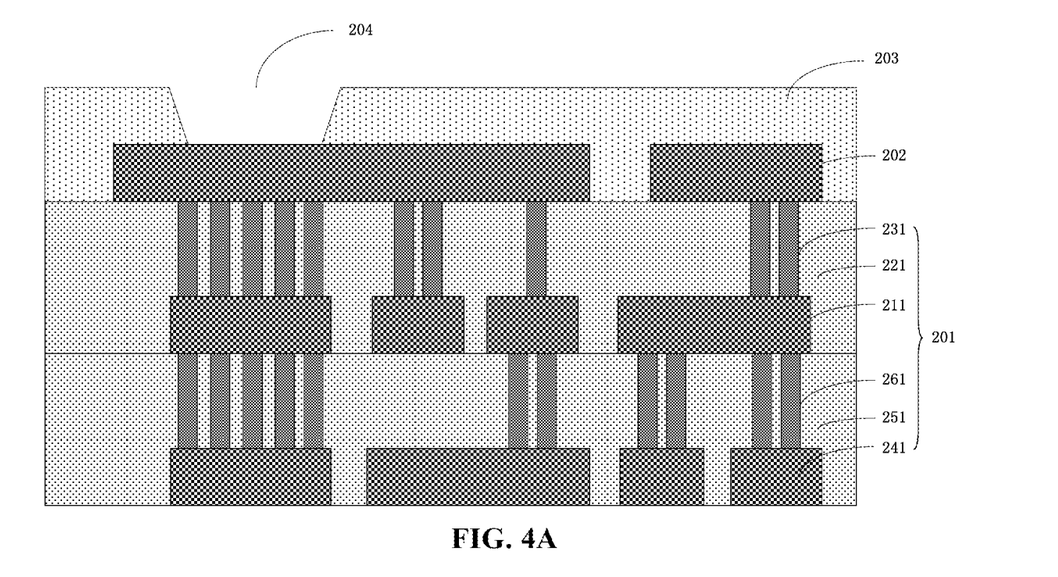
FIGS. 4A-4C are cross-sectional views illustrating intermediate stages of a method for manufacturing a bonding pad structure according to a third embodiment of the present disclosure.
Figure 4B:
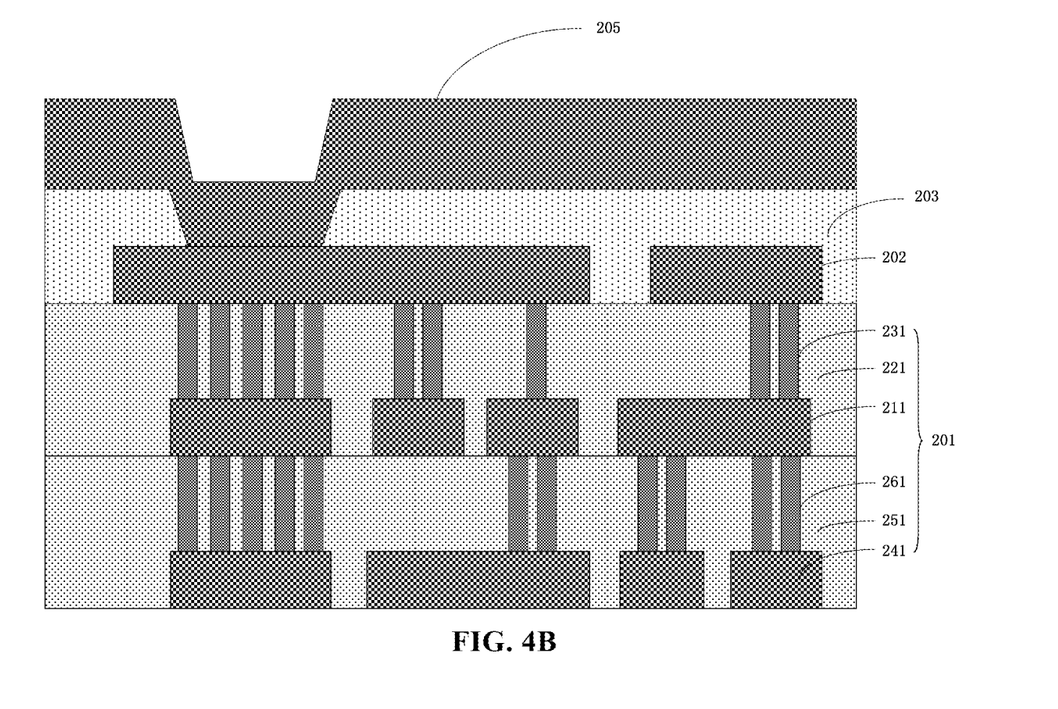
Figure 4C:
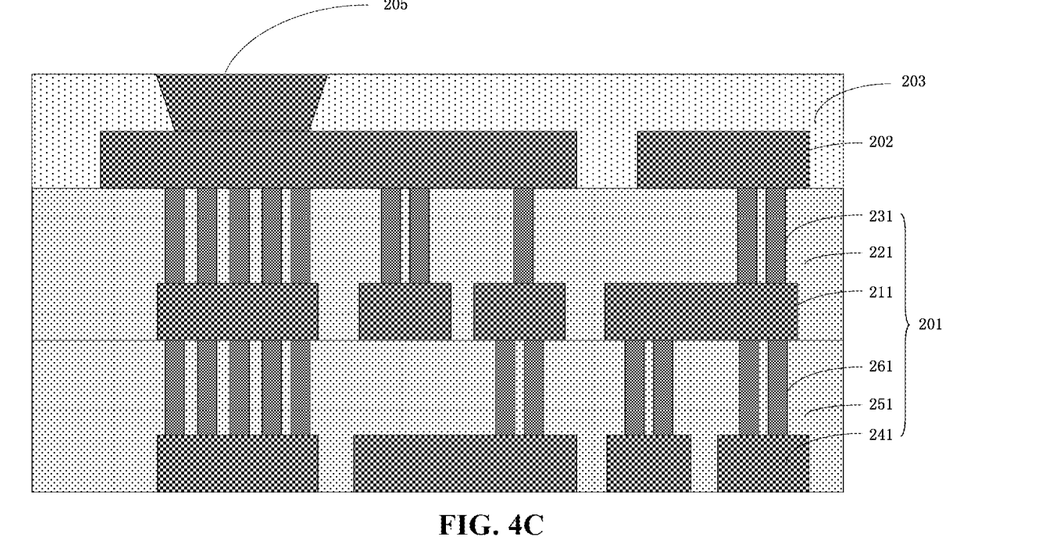

FIGS. 4A-4C are cross-sectional views illustrating intermediate stages of a method for manufacturing a bonding pad structure according to a third embodiment of the present disclosure. It should be noted that only the differences from the first and second embodiments will be described in the following description, the parts similar to those of the first and second embodiments may be referred to the above-described sections and the description will be omitted herein.

Referring to FIG. 4A, a substrate structure is provided. The substrate structure may include a substrate 201, a first metal layer 202 on substrate 201, and a passivation layer 203 on first metal layer 202. Passivation layer 203 has an opening 204 extending to first metal layer 202.

Substrate 201 may further include, in addition to a third metal layer (e.g., a copper layer) 211 disposed below first metal layer 202, a fourth metal layer (e.g., a copper layer) 241 disposed below third metal layer 211. Substrate 201 may also include a first dielectric layer (e.g., a silicon oxide layer) 221 disposed between first metal layer 202 and third metal layer 211, and a second dielectric layer (e.g., a silicon oxide layer) 251 disposed between third metal layer 211 and fourth metal layer 241. Substrate 201 may further include a metal plug (e.g., a tungsten plug) 231 electrically connecting the spaced apart segments of first metal layer 202 and the spaced apart segments of third metal layer 211. Substrate 201 may further include a metal plug (e.g., a tungsten plug) 261 electrically connecting third metal layer 211 and fourth metal layer 241.

In one embodiment, first metal layer 202, third metal layer 211, and fourth metal layer 241 each may include a plurality of segments that are spaced apart, as shown in FIG. 4A. Preferably, first metal layer 202 may include a first number of segments smaller than a second number of segments included in third metal layer 211, and third metal layer 211 includes the second number of segments that is smaller than the third number of spaced apart segments included in fourth metal layer 241. A segment of first metal layer 202 may be connected to one or more segments of third metal layer 211 through one or more metal plugs 231. A segment of third metal layer 211 may be connected to one or more segments of fourth metal layer 241. In this way, the same voltage can be applied to the one or more of segments of third metal layer 211 through a segment of first metal layer 202, and the same voltage can be applied to the one or more segments of fourth metal layer 241 through a segment of third metal layer 211.

Thereafter, a second metal layer is formed filling the opening.

Referring to FIG. 4B, a second metal layer (e.g., an aluminum layer) 205 is formed by deposition on the substrate structure shown in FIG. 4A. Second metal layer 205 fills opening 204 and covers the surface of passivation layer 203.

Thereafter, a portion of second metal layer 205 disposed outside the opening may be removed using techniques described above. For example, in one embodiment, second metal layer 205 may be etched using the upper surface of passivation layer 203 as an etch stop layer to retain second metal layer 205 formed in opening 204, as shown in FIG. 4C. In another embodiment, a planarization (e.g., a chemical mechanical polishing) process may be performed on second metal layer 205 shown in FIG. 4B to retain a portion of second metal layer 205 formed in opening 204 as shown in FIG. 4C. In one embodiment, the upper surface of second metal layer 205 and the upper surface of passivation layer 203 may be substantially flush, i.e., flush within the process tolerance, such that second metal layer 205 filling opening 204 does not affect other portions of the pad structure.

A pad structure is obtained according to the method shown in FIGS. 4A-4C. The pad structure will be described below with reference to FIG. 4C.

The pad structure shown in FIG. 4C also includes a fourth metal layer 241 disposed below third metal layer 211 as compared to the pad structure shown in FIG. 3C. The pad structure shown in FIG. 4C also includes a second dielectric layer 251 disposed between third metal layer 211 and fourth metal layer 241, and a plurality of metal plugs 261 disposed in the second dielectric layer and electrically connecting third metal layer 211 and fourth metal layer 241.

It will be appreciated by those of skill in the art that, in other embodiments, substrate 201 may further include more metal layers disposed below fourth metal layer 241, the metal layers are separated from each other by an interlayer dielectric layer, and each of the metal layers may include a plurality of spaced apart segments. Each of the segments of a current metal layer may be electrically connected to one or more segments included in a metal layer below the current metal layer through one or more metal plugs.

The bond pad structure provided by the present disclosure may be used in a semiconductor device, such as, but not limited to, an image sensor.

Accordingly, the present disclosure also provides an image sensor that may include a bond pad structure of the above-described embodiment. In one embodiment, the image sensor may be a CMOS image sensor.

Figure 5:
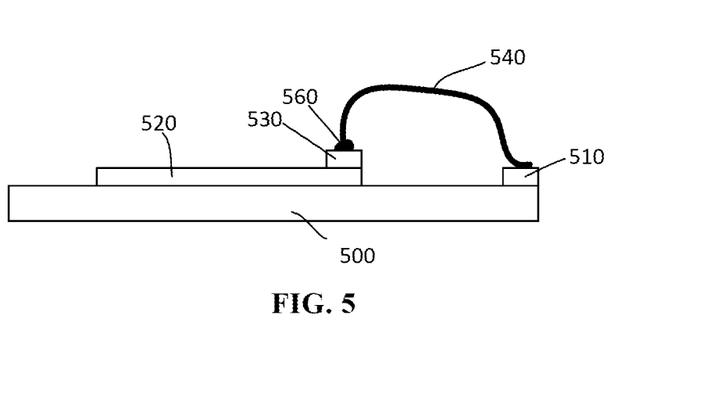
FIG. 5 is a cross-sectional view of a packaged semiconductor device including an electronic bonding pad structure connected to a lead pad by a bonding wire according to an embodiment of the present disclosure.

FIG. 5 is a cross-sectional view of a packaged semiconductor device including a bond pad structure connected to a package (lead) pad by a bonding wire according to an embodiment of the present disclosure. As shown in FIG. 5, the packaged semiconductor device may include a package substrate 500 including a lead pad 510 and a semiconductor device including a substrate 520 and a bond pad structure 530. Bond pad structure 530 may be one of the bond pad structure described and shown in FIGS. 2C, 3C, and 4C. Bond pad structure 530 is connected to lead pad 510 through a bonding wire 540. The connection may be formed, for example, by a conventional thermosonic wire bond process. In one embodiment, the wire bonding may be performed using a combination of heat, pressure, and ultrasonic energy for a predetermined time duration. The wire bonding produces a gold ball 560 that forms an electrical and metallurgical connection to the bond pad structure 530.

Thus, embodiments of the present disclosure provide a detailed description of a bond pad structure and methods of manufacturing the same. Details of well-known processes are omitted in order not to obscure the concepts presented herein.

It is to be understood that the above described embodiments are intended to be illustrative and not restrictive. Many embodiments will be apparent to those of skill in the art upon reviewing the above description. The scope of the disclosure should, therefore, be determined not with reference to the above description, but instead should be determined with reference to the appended claims along with their full scope of equivalents.

What is claimed is:

1. A method for manufacturing a bond pad structure, comprising:

providing a substrate structure including a substrate disposed on a package substrate, a first metal layer on the substrate, and a passivation layer on the first metal layer, the first metal layer is completely embedded in the passivation layer, the passivation layer having an opening extending to the first metal layer, a width of the opening decreases linearly with a depth of the opening; wherein the substrate comprises:

a third metal layer in the substrate and below the first metal layer;

a first dielectric layer over the third metal layer and below the first metal layer; and a first metal plug in the first dielectric layer electronically connecting the first metal layer and the third metal layer; and forming a bond pad by filling the opening of the passivation layer with a second metal layer, the bond pad having an upper surface flush with an upper surface of the passivation layer, a bottom surface flush with an interface surface between the passivation layer and the first metal layer, and configured to directly connect through a bonding wire to a lead pad disposed on the package substrate.

2. The method of claim 1, wherein filling the opening comprises:

forming the second metal layer on the substrate;

etching the second metal layer using the passivation layer as an etch stop layer so as to retain the second metal layer in the opening.

3. The method of claim 1, wherein filling the opening comprises:

forming the second metal layer on the substrate;

performing a planarization process on the second metal layer so as to retain the second metal layer in the opening.

4. The method of claim 1, wherein providing the substrate structure comprises:

providing the substrate;

forming the first metal layer on the substrate;

forming the passivation layer on the first metal layer;

etching the passivation layer to remove a portion of the passivation layer to form the opening exposing a desired region of the first metal layer.

5. The method of claim 1, wherein:

the first metal layer comprises a first number of spaced apart segments and the third metal layer comprises a second number of spaced apart segments, a side surface of the bond pad is not perpendicular to the top surface of the first metal layer, and the bond pad is completely embedded in the passivation layer.

6. The method of claim 5, wherein the first number of spaced apart segments is smaller than the second number of spaced apart segments; and a segment of the first number of spaced apart segments is electrically connected to one or more segments of the second number of spaced apart segments.

7. The method of claim 5, wherein the substrate further comprises:

a fourth metal layer in the substrate and below the third metal layer;

a second dielectric layer over the fourth metal layer and below the third metal layer; and a second metal plug in the second dielectric layer electrically connecting the third metal layer and the fourth metal layer.

8. The method of claim 7, wherein the fourth metal layer comprises a third number of spaced apart segments.

9. The method of claim 8, wherein the second number of spaced apart segments is smaller than the third number of spaced apart segments; and a segment of the second number of spaced apart segments is electrically connected to one or more segments of the third number of spaced apart segments.

10. The method of claim 1, wherein:

the first and second metal layers each comprise aluminum;

the third metal layer comprises copper; and the passivation layer comprises a silicon oxide layer on the first metal layer and a silicon nitride layer on the silicon oxide layer.

* * * * *